United States Patent
Kireev (10) Patent No.: US 9,048,017 B2
(45) Date of Patent: Jun. 2, 2015

(54) CIRCUITS FOR AND METHODS OF IMPLEMENTING A GAIN STAGE IN AN INTEGRATED CIRCUIT

(71) Applicant: Xilinx, Inc., San Jose, CA (US)

(72) Inventor: Vassili Kireev, San Jose, CA (US)

(73) Assignee: XILINX, INC., San Jose, CA (US)

( * ) Notice: Subject to any disclaimer, the term of this patent is extended or adjusted under 35 U.S.C. 154(b) by 99 days.

(21) Appl. No.: 13/828,943

(22) Filed: Mar. 14, 2013

(65) Prior Publication Data

US 2014/0266434 A1   Sep. 18, 2014

(51) Int. Cl.
| | |
|---|---|
| *H01F 17/00* | (2006.01) |
| *H01F 41/04* | (2006.01) |
| *H03F 3/04* | (2006.01) |
| *H01L 23/522* | (2006.01) |
| *H01L 49/02* | (2006.01) |

(52) U.S. Cl.
CPC .......... *H01F 17/0013* (2013.01); *H01F 41/041* (2013.01); *H03F 3/04* (2013.01); *Y10T 29/4902* (2013.01); *H01L 23/5227* (2013.01); *H01L 28/10* (2013.01); *H01L 2924/3011* (2013.01); *H01L 2924/0002* (2013.01)

(58) Field of Classification Search
CPC ..................... H01L 23/5227; H01L 2924/3011
USPC .......................................................... 257/531
See application file for complete search history.

(56) References Cited

U.S. PATENT DOCUMENTS

| | | | |
|---|---|---|---|
| 4,990,802 A | 2/1991 | Smooha | |
| 5,017,902 A | 5/1991 | Yerman et al. | |
| 5,610,433 A | 3/1997 | Merrill et al. | |
| 5,831,331 A * | 11/1998 | Lee | 257/659 |
| 7,046,114 B2 * | 5/2006 | Sakata | 336/200 |
| 7,265,433 B2 | 9/2007 | Pillai et al. | |
| 8,143,987 B2 | 3/2012 | Kireev | |
| 2004/0155675 A1 | 8/2004 | Zerbe et al. | |
| 2005/0052272 A1 | 3/2005 | Tiebout | |
| 2005/0190035 A1 | 9/2005 | Wang | |
| 2005/0258508 A1 | 11/2005 | Sakamoto | |
| 2006/0181385 A1 * | 8/2006 | Hurley | 336/200 |
| 2007/0247269 A1 | 10/2007 | Papananos | |
| 2008/0169895 A1 | 7/2008 | Lee | |

(Continued)

FOREIGN PATENT DOCUMENTS

| | | |
|---|---|---|
| DE | 102006039733 A1 | 3/2007 |
| EP | 0 997 945 A1 | 5/2000 |

(Continued)

OTHER PUBLICATIONS

U.S. Appl. No. 13/347,538, filed Jan. 10, 2012, Kireev.

(Continued)

*Primary Examiner* — Stephen W Smoot
*Assistant Examiner* — Edward Chin
(74) *Attorney, Agent, or Firm* — John J. King; Lois D. Cartier (57) ABSTRACT

A circuit for implementing a gain stage in an integrated circuit is described. The circuit comprises a first inductor formed in a first plurality of metal layers; a second inductor formed in a second plurality of metal layers, the second inductor coupled to a center tap of the first inductor; and wherein the second inductor has a diameter that is less than a diameter of the first inductor. A method of implementing a gain stage in an integrated circuit is also described.

20 Claims, 7 Drawing Sheets

(56) References Cited

U.S. PATENT DOCUMENTS

| | | | |
|---|---|---|---|
| 2009/0108978 A1* | 4/2009 | Loke et al. | 336/200 |
| 2009/0115562 A1* | 5/2009 | Lee et al. | 336/200 |
| 2010/0128908 A1 | 5/2010 | Park | |
| 2010/0157494 A1 | 6/2010 | Kim et al. | |
| 2011/0105072 A1 | 5/2011 | Bhagat et al. | |
| 2011/0248811 A1* | 10/2011 | Kireev | 336/200 |
| 2014/0084862 A1* | 3/2014 | Kawaguchi et al. | 320/108 |

FOREIGN PATENT DOCUMENTS

| | | |
|---|---|---|
| TW | 200839805 A | 10/2008 |
| WO | WO 96/28832 A1 | 9/1996 |
| WO | WO 2008/014506 A2 | 1/2008 |

OTHER PUBLICATIONS

U.S. Appl. No. 13/347,518, filed Jan. 10, 2012, Kireev et al.

Allam, Mohammed W., "Dynamic Current Mode Logic (DyCML): A New Low-Power High-Performance Logic Style," *IEEE Journal of Solid-State Circuits*, Mar. 2001, pp. 550-558, vol. 36, No. 3, IEEE, Piscataway, New Jersey, USA.

Galal, Sherif, "Broadband ESD Protection Circuits in CMOS Technology," *IEEE Journal of Solid-State Circuits*, Dec. 2003, pp. 2334-2340, vol. 38, No. 12, IEEE, Piscataway, New Jersey, USA.

Kossel, Marcel et al., "A T-Coil-Enhanced 8.5 GB/s High-Swing SST Transmitter in 65 nm Bulk CMOS with <-16 dB Return Loss Over 10 GHz Bandwidth," *IEEE Journal of Solid-State Circuits*, Dec. 2008, pp. 2905-2920, vol. 43, No. 12, IEEE, Piscataway, New Jersey, USA.

Linten, D. et al., "A 4.5 kV HBM, 300 V CDM, 1.2 kV HMM ESD Protected DC-to-16.1 GHz Wideband LNA in 90 nm CMOS," *Proc. of the 2009 EOS/ESD Symposium*, pp. 5A.6-1 to 5A.6-6, ESD Association, Rome, New York, USA.

Pillai, Edward, et al. "Novel T-Coil Structure and Implementation in a 6.4-GB/s CMOS Receiver to Meet Return Loss Specifications," *2007 Electronic Components and Technology Conference*, pp. 147-153, IEEE, Piscataway, New Jersey, USA.

Zolfaghari, Alireza et al. "Stacked Inductors and Transformers in CMOS Technology," *IEEE Journal of Solid-State Circuits*, Apr. 2001, pp. 620-628, vol. 36, No. 4, IEEE, Piscataway, New Jersey, USA.

Han, Ki Jin et al., "Eye-Pattern Design for High-Speed Differential Links Using Extended Passive Equalization," *IEEE Transactions on Advanced Packaging*, May 2008, pp. 246-257, vol. 31, No. 2, IEEE, Piscataway, New Jersey, USA.

Koutsoyannopoulos, Yorgos K. et al., "Systematic Analysis and Modeling of Integrated Inductors and Transformers in RF IC Design," *IEEE Transactions on Circuits and Systems—II: Analog and Digital Signal Processing*, Aug. 2000, pp. 699-713, vol. 47, No. 8, IEEE, Piscataway, New Jersey, USA.

Zolfaghari, Alireza et al., "Stacked Inductors and Transformers in CMOS Technology," *IEEE Journal of Solid-State Circuits*, Apr. 2001, pp. 620-628, vol. 36, No. 4, IEEE, Piscataway, New Jersey, USA.

* cited by examiner

CIRCUITS FOR AND METHODS OF IMPLEMENTING A GAIN STAGE IN AN INTEGRATED CIRCUIT

TECHNICAL FIELD

The present invention relates generally to integrated circuits, and in particular, to circuits for and methods of implementing a gain stage in an integrated circuit.

BACKGROUND

The transfer of data is an important aspect of any integrated circuit device. While data may be transferred between integrated circuit devices through a lossy channel, one important aspect of any integrated circuit device is the efficient processing of the received data within an integrated circuit. As the performance requirements for integrated circuits continue to become more demanding, it is important to provide improved circuits and methods of transferring data. More particularly, there is always pressure to increase the speed of an integrated circuit while reducing both the size of the integrated circuit and power consumed by the integrated circuit. The same pressure is applied to the data links between integrated circuits. As the number of logic elements and memory cells in integrated circuits is increased, the density of data links and their power is also increased.

A received serial data stream experiences post-processing in an analog domain before it converted into the digital domain and de-serialized. This post-processing is implemented on multiple cascaded high-speed analog circuits amplifying and equalizing a signal, distorted and attenuated in a lossy channel, to the level necessary for error free sampling into the digital domain. Another usage of high-speed analog circuits is precise clocking needed for accurate sampling of the received data stream. All high speed analog circuits require high bandwidth and low power consumption that make it very attractive to use a peaking network based on a passive inductor. However, broad usage of a passive inductor for increasing bandwidth and reducing power consumption of high speed analog circuits is prevented by large inductor footprints that not only consume integrated circuit "real estate," but can also block power and signal distribution. A particular implementation of the inductor may also affect the resistance of the inductor and the magnetic coupling of the inductor, for example. Accordingly, it is difficult to implement an inductor of a high speed analog circuit which achieves many of the objectives of the circuit.

SUMMARY

A circuit for implementing a gain stage in an integrated circuit is described. The circuit comprises a first inductor formed in a first plurality of metal layers; a second inductor formed in a second plurality of metal layers, the second inductor coupled to a center tap of the first inductor; and wherein the second inductor has a diameter that is less than a diameter of the first inductor.

According to an alternate arrangement, a circuit for implementing a gain stage in an integrated circuit comprises a first transistor coupled to receive an input signal at a control terminal; and a T-coil inductor coupled to the first transistor, the T-coil inductor comprising a first inductor and a second inductor coupled to a center tap of the first inductor; wherein the second inductor has a diameter that is less than a diameter of the first inductor.

A method of implementing a gain stage in an integrated circuit is also described. The method comprises implementing a first inductor in a first plurality of metal layers; implementing a second inductor in a second plurality of metal layers, coupling the second inductor to a center tap of the first inductor; wherein the second inductor has a diameter that is less than a diameter of the first inductor.

DETAILED DESCRIPTION

Figure 1:
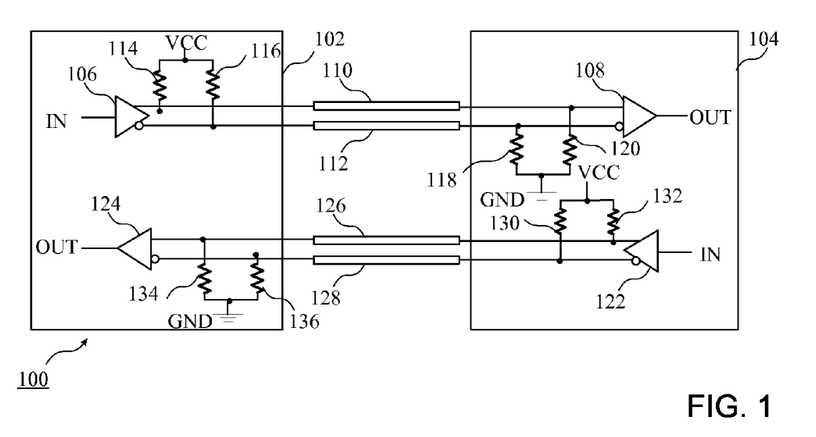
FIG. 1 is a block diagram of a system for transmitting data.

Turning first to FIG. 1, a block diagram of a system 100 for transmitting data comprising a first transceiver 102 and a second transceiver 104 is shown. The first transceiver 102 comprises a transmitter circuit 106 coupled to a receiver circuit 108 in the second transceiver by a pair of transmission lines 110 and 112. The outputs of the transmitter 106 comprise differential outputs which are coupled by pull-up resistors 114 and 116 to a first reference voltage, such as VCC. The differential outputs may be a pair of complementary data, for example. The receiver circuit 108 is coupled to receive the differential signal at two inputs which are coupled by pull-down resistors 118 and 120 to a second reference voltage, such as ground. While the outputs of the transmitter circuits and the receiver circuit of FIG. 1 are coupled to pull-up and pull-down resistors, respectively, it should be understood that the outputs of the transmitter circuits could instead be coupled to pull-down resistors and that the inputs of the receiver circuits could instead be coupled to pull-up resistors.

In order to provide the bi-directional transfer of data, a transmitter circuit 122 in the second transceiver is coupled to a receiver circuit 124 in the first transceiver by a pair of transmission lines 126 and 128. The outputs of the transmitter 122 also comprise differential outputs which are coupled by pull-up resistors 130 and 132 to the reference voltage VCC. The receiver circuit 124 is coupled to receive the differential signal at two inputs which are coupled by pull-down resistors 134 and 136 to ground. While the system 100 of FIG. 1 is an example of a portion of a system having transceivers, it should be understood that the receiver circuits described in more detail below could be implemented in any type of system having transceivers for transmitting and receiving data.

Figure 2:
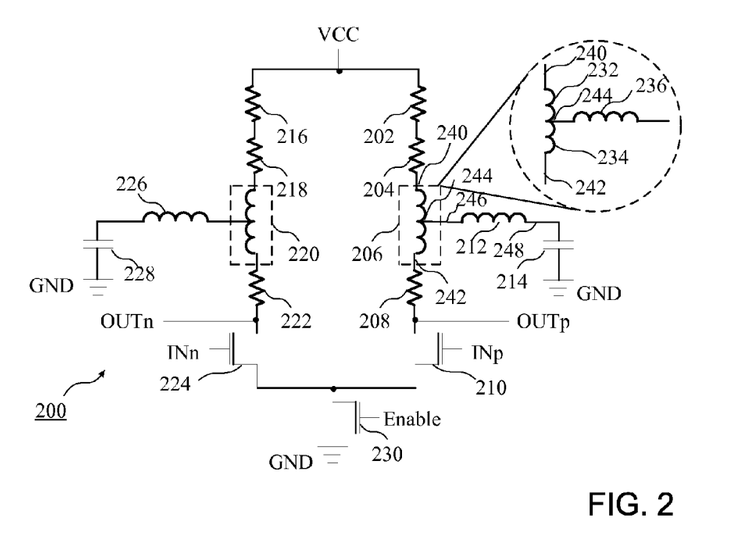
FIG. 2 is a block diagram of a gain stage circuit which could be implemented in the system of FIG. 1.

Turning now to FIG. 2, a block diagram of a gain stage circuit 200 which could be implemented as gain stage 108 or 124 of FIG. 1 for example is shown. In particular, the gain stage circuit 200 comprises a plurality of elements coupled in series for generating a first output (OUTp). The elements coupled in series include a first resistor 202, a second resistor 204, an inductor 206, a resistor 208, and a transistor 210 as shown. The transistor 210 is coupled to receive a first input data signal (INp) of a complementary pair of data signals at its gate, and generates the first output data signal OUTp at its drain.

A second series of elements is coupled to receive a second differential input data signal of the complementary pair of data signals and generate a second differential output data signal. In particular, the elements of a second group of elements coupled in series include a first resistor 216, a second resistor 218, an inductor 220, a resistor 222, and a transistor 224. The transistor 224 is coupled to receive a second input data signal (INn) of the complementary pair of data signals at its gate and generate a second output data signal OUTn at its drain. A control transistor 230 may be coupled to receive an enable signal at its gate to enable the gain stage.

As shown in the expanded view of FIG. 2, the inductor 206 comprises T-coils with a first inductor 232 and a second inductor 234 coupled in series at a center tap 244, with a third inductor 236 coupled to the center tap 244. The second coil 212 extends between a first terminal 246 and a second terminal 248, where the first terminal 246 is coupled to the center tap 238. A capacitor 214 is coupled between second terminal 248 and ground (GND). It should be noted that the inductor 236 is not a physical element in the circuit, but is included to model the negative inductance in the circuit and compensate for the negative inductance (as a result of the mutual coupling of the first inductor 232 and the second inductor 234) by providing positive inductance through inductor 212. It should also be noted that, unlike resistor 202 which is an element implemented in the gain stage circuit 200, the resistors 204 and 208 represent parasitic impedances of the inductor. The inductor 212 may have an inductance which is less than the inductance of inductor 206. As will be described in more detail in FIGS. 4-10, the smaller inductance of inductor 212 can be achieved by having a smaller diameter of coils of the inductor 212 compared to the coils of inductor 206. The implementation of the inductors 206 and 212 will be described in more detail in reference to FIGS. 4-10. Further, it should be noted that the inductor 220 is implemented in the same way as inductor 206 as set forth above. An inductor 226 is coupled to a center tap of inductor 220, and a capacitor 228 is coupled between inductor 226 and ground (GND).

Figure 3:
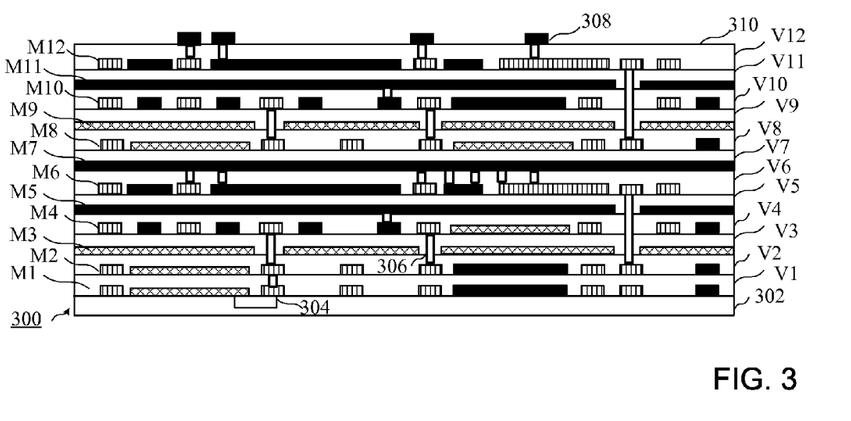
FIG. 3 is a cross-sectional view of an integrated circuit having a plurality of metal layers.

Turning now to FIG. 3, a cross-sectional view shows an integrated circuit 300 having a plurality of metal layers. As shown in FIG. 3, metal layers having conductive traces for different signal types are provided. By way of example, a ground trace is indicated in solid black, a signal trace is indicated by cross-hatched lines, and a power voltage trace is indicted by vertical lines. The integrated circuit includes a substrate 302 having circuit elements 304 which are coupled to various interconnect elements formed in a first metal layer M1 on the surface of the substrate 302. Vias, shown for example by 306, enable the connection of various traces to traces in other layers. The metal layers are separated by a dielectric layers, shown here as the white material not occupied by the metal traces or vias formed in the dielectric material of the dielectric layers. External contacts 308 may be implemented as input/output (I/O) contacts on a top surface 310 of the integrated circuit as shown for enabling the input and output of data associated with the circuit elements 304 and providing reference voltages, such as power and ground to the circuit elements.

The integrated circuit of FIG. 3 as shown comprises 12 metal layers M1-M12, and 12 corresponding via layers V1-V12. As will be described in more detail below, the metal layers may have different thicknesses and be used for different types of signals or circuit elements, including the inductors of FIG. 2 as shown and described in more detail below in reference to FIGS. 4-10. While 12 metal layers and corresponding via layers are shown, it should be understood that greater or fewer layers could be implemented.

Figure 4:
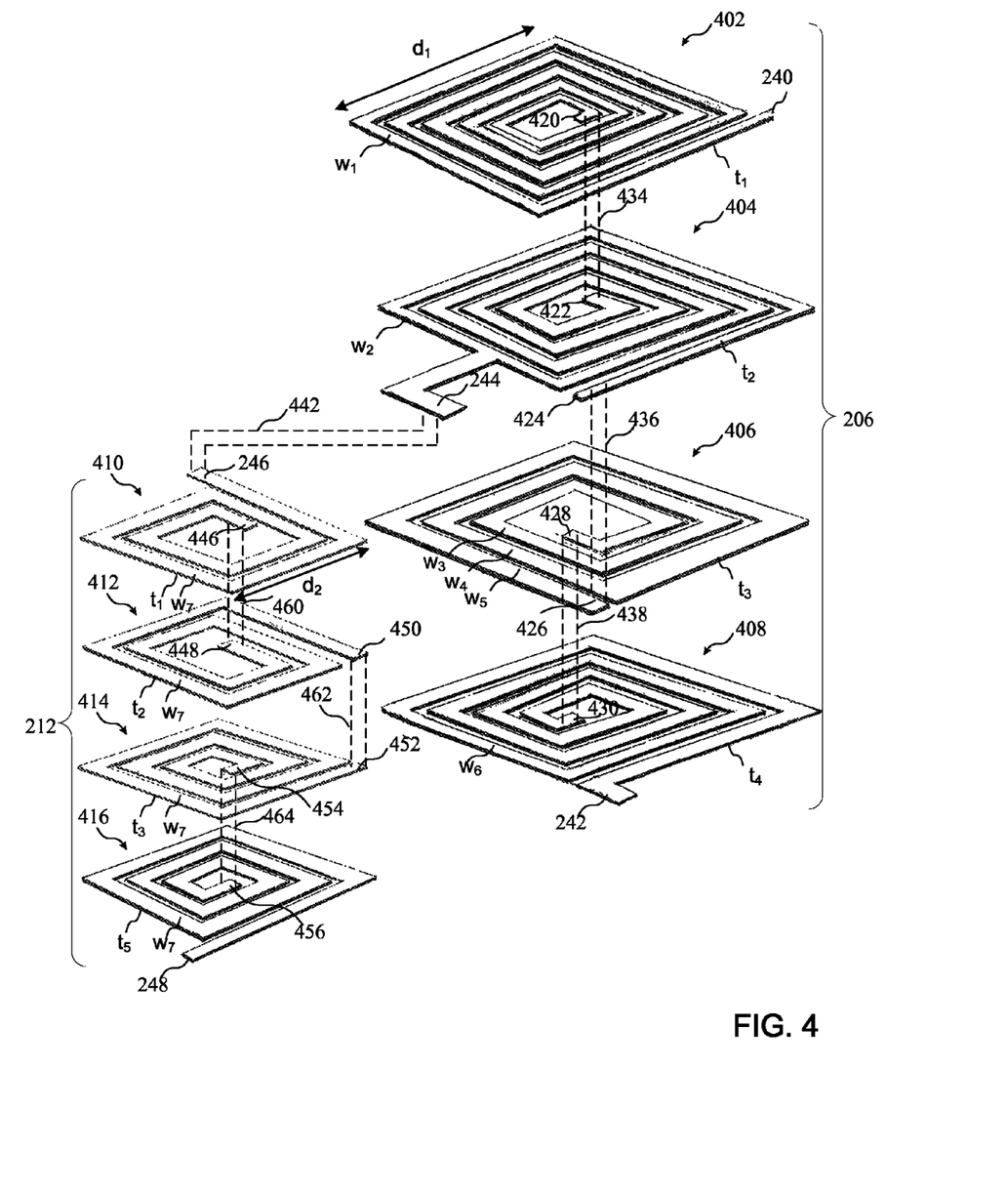
FIG. 4 is an expanded view of an inductor of the gain stage circuit of FIG. 2.

Turning now to FIG. 4, an expanded view shows an inductor of the gain stage circuit of FIG. 2. As shown in FIG. 4, the inductor 206 has 4 coils 402-408 implemented in at least 4 metal layers, where each coil has a plurality of loops. Similarly, the inductor 212 comprises four coils 410-416, where each of the coils has a plurality of loops. The coil 402 extends from a first terminal 240 to a second terminal 420 and has 4 loops as shown. The coil 404 extends from the first terminal 422 to a second terminal 424, and also has 4 loops. The coil 406 extends from a first terminal 426 to a second terminal 428 and has three loops. Finally, the coil 408 extends from a first terminal 430 to the second terminal 242 and has four loops.

The loops of the four coils are formed in different metal layers, and the coils are coupled together by vias between the metal layers. More particularly, the second terminal 420 of the coil 402 is coupled to the first terminal 422 of the coil 404 by a via 434. The second terminal 424 of the coil 404 is coupled to the first terminal 426 of the coil 406 by a via 436, and the second terminal 428 of the coil 406 is coupled to the first terminal 430 of coil 408 by a via 438.

The inductor 212 is coupled to the center tap 244 of the inductor 206 by a via 442 at the terminal 246. A second terminal 446 of the coil 402 is coupled to the first terminal 448 of the coil 412 by a via 460. The second terminal 450 of the coil 412 is coupled to a first terminal 452 of the coil 414 by a via 462, and a second terminal 454 of the coil 414 is coupled to the first terminal 456 of coil 416 by a via 464.

The metal layers used to from each of the inductors 206 and 212 may be consecutive metal layers and may have terminals which are coupled by a via in a single via layer. As will be described in more detail below, a given coil may be formed using a plurality of metal layers. The plurality of metal layers used to form inductor 212 may be the same as or a subset of the plurality of metal layers used to form inductor 206.

Figure 5:
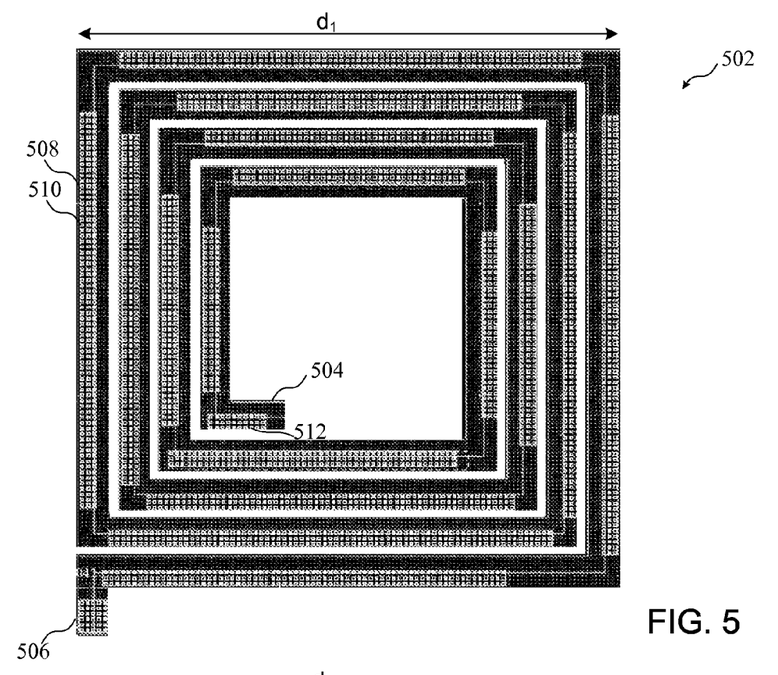
FIG. 5 is a top plan view of a first metal layer of the inductor of FIG. 4 implemented in an integrated circuit.
Figure 6:
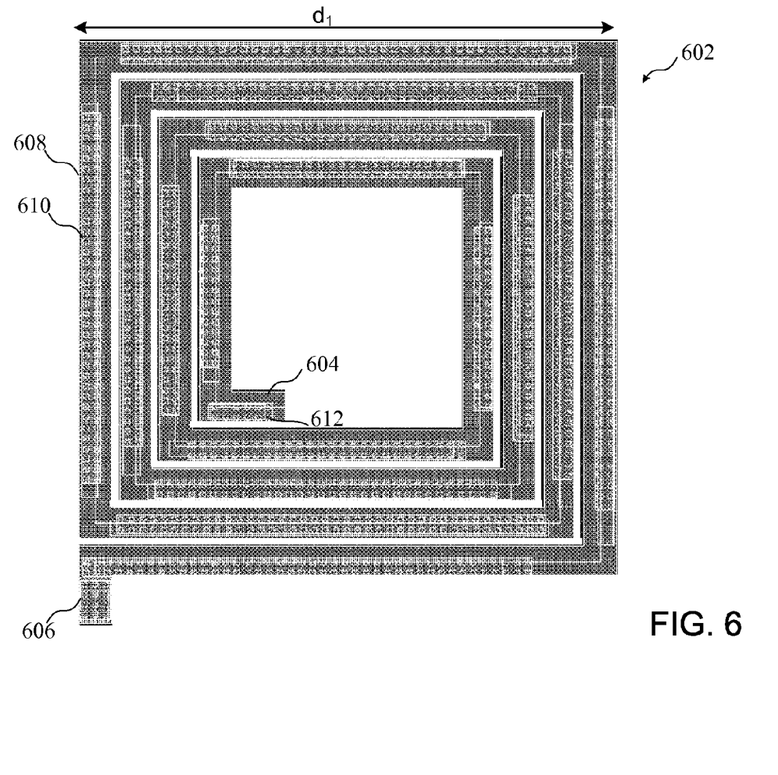
FIG. 6 is a top plan view of a second metal layer of the inductor of FIG. 4 implemented in an integrated circuit.

Top plan views of various metal layers are shown in FIGS. 5-10. According to one arrangement of metal layers, the bottom coil 408 may be formed from a series of coils in different layers which are connected by vias between the metal layers. As shown in FIG. 5, a coil 502 comprises 4 loops which extend from the terminal 504 to the terminal 506. Conductive elements 508 comprising a plurality of vias 510, shown on each side of each loop, enable connecting the coil 502 to a coil 602. The vias 512 correspond to the vias 438 to couple terminal 430 of coil 408 to terminal 428 of coil 406. The coil 408 as shown is a square structure having a diameter $d_1$. However, it should be understood that other shapes, such as rectangular or circular loops, could be implemented.

Figure 7:
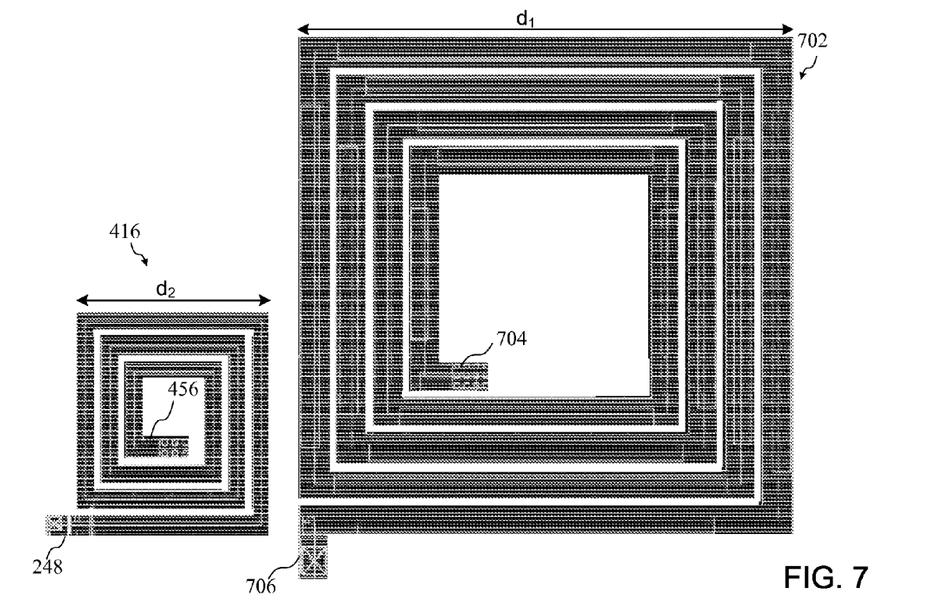
FIG. 7 is a top plan view of a third metal layer of the inductor of FIG. 4 implemented in an integrated circuit.
Figure 8:
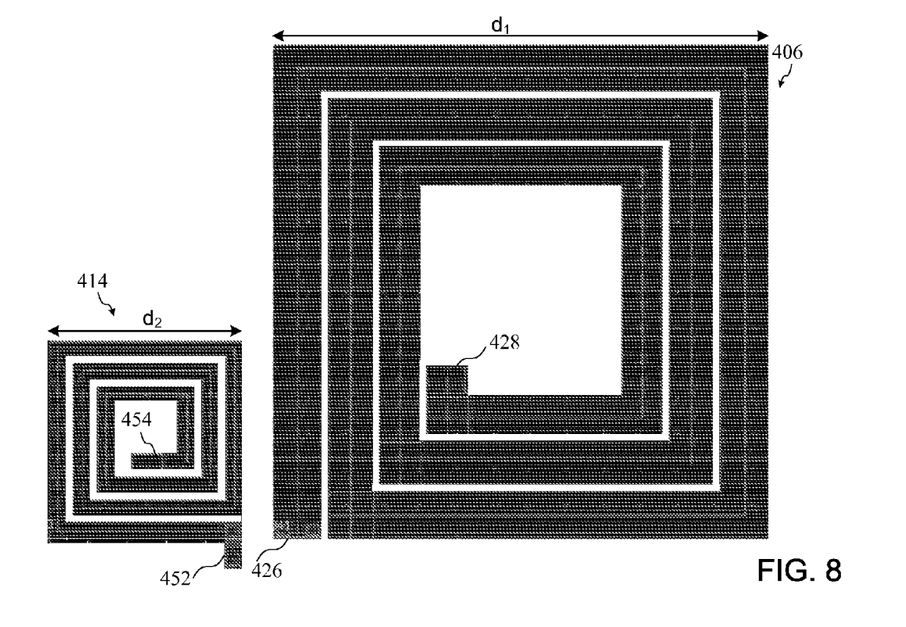
FIG. 8 is a top plan view of a fourth metal layer of the inductor of FIG. 4 implemented in an integrated circuit.

The coil 602, which also extends from a first terminal 604 to a second terminal 606, has substantially the same size and shape as the coil 502. Similarly, conductive elements 608 comprising a plurality of vias 610, shown on each side of each loop, enable connecting the coil 602 to a coil 702. The coil 702, which also extends from a first terminal 704 to a second terminal 706, has substantially the same size and shape as the coils 502 and 602. The coils 502, 602 and 707 together form the bottom coil 408, where the terminals 504, 604, and 704 are a part of the terminal 430 and the terminals 506, 606, and 706 are a part of the terminal 242. That is, each of the plurality of vias 508, 608 and 708 on each side of the loop for each loop in the metal layers of FIGS. 5, 6, and 7 form a single coil with 4 loops having a thickness of the three metal loops and the vias between the metal layers. Also shown in FIG. 7 is the coil 416, which is only made up of a single metal layer. That is, unlike the coil 408 which is made up of traces in 3 metal layers coupled together by vias, coil 416 comprises metal traces only in the metal layer having coil 702. The coil 416 is also a square coil having a diameter $d_2$ which is less than the diameter $d_1$, where d1 could be approximately 13 micrometers and $d_2$ could be approximately 5 micrometers.

Figure 9:
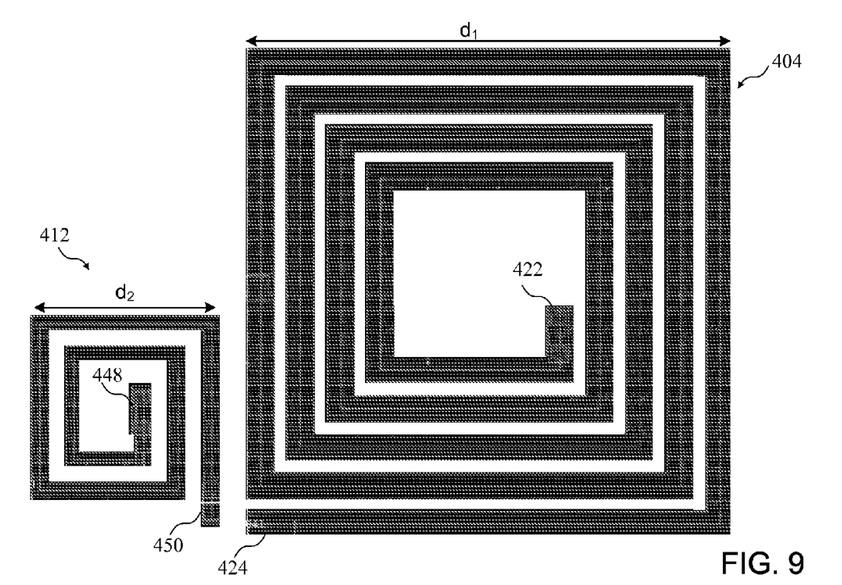
FIG. 9 is a top plan view of a fifth metal layer of the inductor of FIG. 4 implemented in an integrated circuit.
Figure 10:
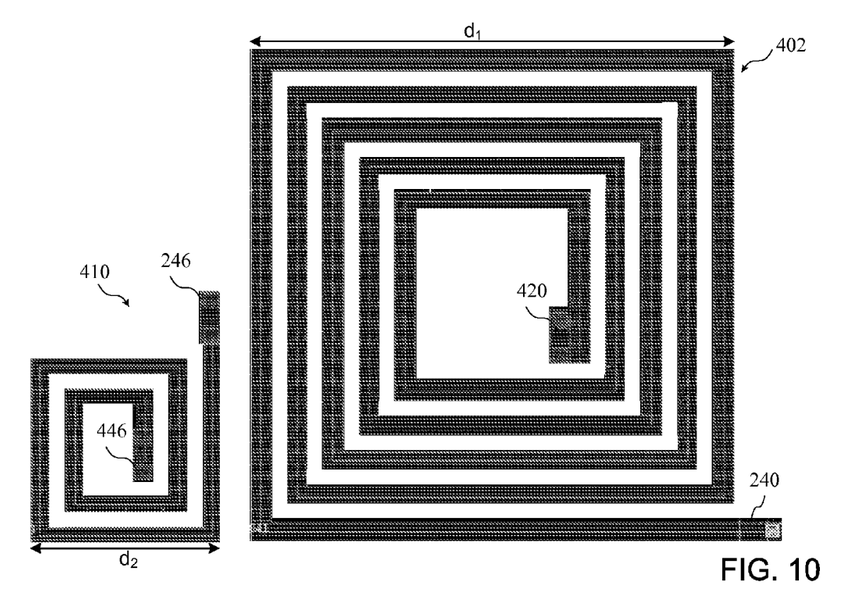
FIG. 10 is a top plan view of a sixth metal layer of the inductor of FIG. 4 implemented in an integrated circuit.

The remaining coils 406, 404, and 402 of the inductor 206 are also formed in a single metal layer with a corresponding coil 414, 412 and 410 of the inductor 212. More particularly, the coil 406 comprises 3 loops, where the width of traces is generally decreasing from the outer loop to the inner loop. That is, $w_3$ is generally wider than $w_4$, which is generally wider than $w_5$. The resistance of the loop is minimized by having wider routing with gradual reduction from the edge to the center. As shown in FIG. 9, each of the sides of the loops of coil 404 (which has 4 loops) has approximately the same width, which is generally less than the widths of the various traces of coil 406. Finally, each of the sides of the loops of coil 402 (which has 5 loops) has approximately the same width $w_1$, which is generally less than the widths of the various traces of coil 404. The width $w_2$ of coil 404, which has only 4 loops, is generally greater than $w_1$ of coil 402, which has 5 loops. The thickness of the metal layers can vary, where the thickness of the lower metal layers starting from M1 is less than the thickness of the upper metal layer M12. While the coils of the inductors of FIG. 4 could be implemented in any the metal layers, the inductors are preferably implemented in the upper metal layers.

Inductors 402 and 410 may be formed in metal layer M12 and have a thickness $t_1$, inductors 404 and 412 may be formed in metal layer M11 and have a thickness $t_2$, inductors 406 and 414 may be formed in metal layer M10 and have a thickness $t_3$, and inductors 408 and 416 may be formed in metal layer M9. As set forth above, inductor 408 may be formed in a plurality of metal layers to provide and increased thickness $t_4$ compared to a thickness of the metal layer M9 alone. However, the lower coil 416 of inductor 212 may be formed in the metal layer M9 alone and has a thickness $t_5$. The widths of the traces of coils 410-416 have a value $w_7$, which is approximately equal.

The T-coil implementation with the smaller coil 212 provides up to 3.5 times the bandwidth (BW) extension of internal circuitry (compared to conventional T-coils) based on a multi-layer inductor 206 having a diameter below 15 micrometers and a multi-layer inductor 212 having a diameter of 5 micrometers. The small T-coil 206 may have high self-resonance frequency, but may suffer from high magnetic coupling between coils when implemented alone. In order to overcome these drawbacks, an additional series inductor 212 coupled to the center tap of the inductor 206 compensates for excessive magnetic coupling. The additional inductor 212 also helps to reduce the effect of T-coil resistance on the operation point and DC gain of the stage. In addition, the arrangement set forth above may simplify the design of a bias circuit for the multiple sequential stage by having different loading, but using the same biasing method. That is, fine tuning of the gain stage can be performed by only changing the dimension of coil 212 to enable keeping DC bias same for all CML stages.

The circuits set forth above may be implemented in a current mode logic (CML) stage, for example. An internal CML stage has less power consumption compare to a conventional receiver input. Current in the driver is in the range of 2-5 mA compare to 10 mA for a conventional receiver. This allows for the same multi-layer structure to make the footprint 2×-3× smaller than an input T-coil, and therefore have a smaller parasitic capacitance or a larger self-resonance frequency. However, the cost for this performance improvement is additional series resistance from thinner metal lines, and a variation over temperature that is on the order of 0.3-0.4% per K that can reach approximately 100% over PVT.

Another problem related to the small footprint of t-coil 206 is an increase of magnetic coupling between T-coil branches associated with smaller size. The configuration results in magnetic coupling k of approximately 0.6-0.8, while a required magnetic coupling is easily achievable with a larger footprint having a magnetic coupling k of approximately 0.2-0.6. If mutual inductance is large, the effective coupling between coils can be controlled by adding inductance to the center tap. Accordingly, large mutual coupling between the coils is beneficial by allowing larger inductance of the branch, but the smaller interwindings provide smaller parasitic resistance and area.

Figure 11:
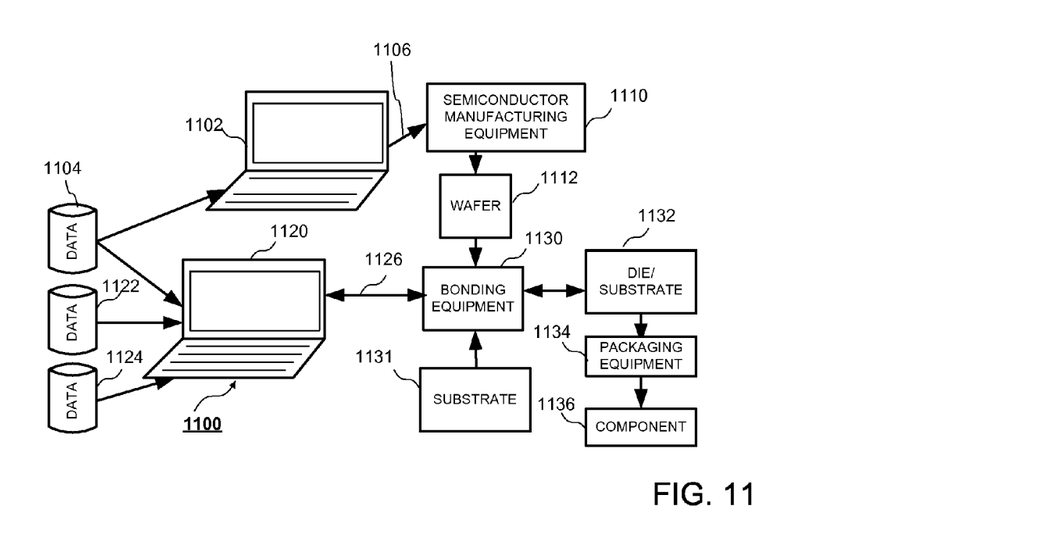
FIG. 11 is a system for producing an integrated circuit.

Turning now to FIG. 11, a system for producing an integrated circuit is shown. The system 1100 comprises computer aided design (CAD) equipment 1102, which could be any computer adapted to run CAD software. The CAD equipment 1102 receives data, such as a master pinlist 1104, and is coupled by a communication link 1106 to semiconductor manufacturing equipment 1110. The semiconductor manufacturing equipment 1110 generates a wafer 1112 having a plurality of die, as is well known in the art.

CAD equipment 1120, which is also coupled to receive the master pinlist 1104, receives a bonding diagram 1122 and substrate artwork 1124. The CAD equipment 1120 is coupled by a communication link 1126 to bonding equipment 1130. The communication links 1106 and 1126 could be any wired or wireless communication link. The bonding equipment generally provides wire bonds from a die from the wafer 1112 to a substrate 1131 receiving the die, as will be described in more detail in reference to other figures. The die/substrate 1132 is coupled to packaging equipment 1134 which generates a finished component 1136, such as an integrated circuit package. Although the system of FIG. 11 provides various elements required for producing an integrated circuit package, it should be understood the elements shown in FIG. 11 could be combined, or additional elements could be provided. In any configuration, the system of FIG. 11 enables generating the required traces in the metal layers to implement the circuit of FIG. 1, and particularly the loops of the inductors shown in FIGS. 4-10.

Figure 12:
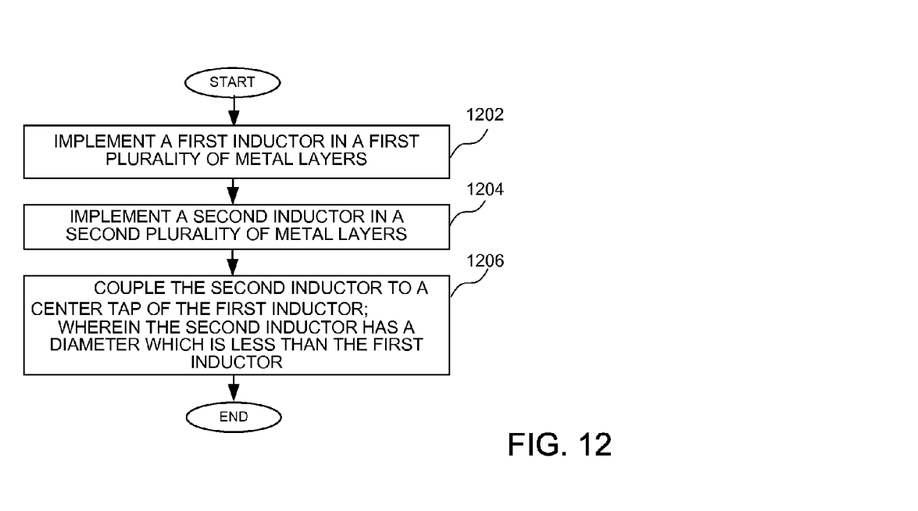
FIG. 12 is a flow chart showing a method of implementing an inductor in an integrated circuit.

Turning now to FIG. 12, a flow chart shows a method of implementing an inductor in an integrated circuit. A first inductor is implemented in a first plurality of metal layers at a step 1202. A second inductor is implemented in a second plurality of metal layers at a step 1204. The second inductor is coupled to a center tap of the first inductor at a step 1206, wherein the second inductor has a diameter which is less than the first inductor. The methods of FIG. 12 could be implemented using the circuits of FIGS. 1-10 as described above, or other suitable circuits. While particular elements are shown in FIG. 12, it should be understood that additional details related to the elements of FIG. 12, or additional elements, can be found in the description of FIGS. 1-10.

It can therefore be appreciated that the new and novel gain stage circuit and method of transmitting data have been described. It will be appreciated by those skilled in the art that numerous alternatives and equivalents will be seen to exist which incorporate the disclosed invention. As a result, the invention is not to be limited by the foregoing embodiments, but only by the following claims.

What is claimed is:

1. A circuit for implementing a gain stage in an integrated circuit, the circuit comprising:
a first inductor in a first plurality of metal layers, the first inductor having a plurality of coils including a first coil in a first metal layer and having a center tap, the first coil coupled by a first via to a second coil in a second metal layer above the first metal layer and coupled by a second via to a third coil in a third metal layer below the first metal layer;
a second inductor in a second plurality of metal layers, the second inductor coupled to the center tap of the first inductor; and
wherein the second inductor has a diameter that is less than a diameter of the first inductor.

2. The circuit of claim 1, wherein:
the integrated circuit comprises a plurality of metal layers extending from a lower metal layer to an upper metal layer; and
the first inductor is situated above the lower metal layer.

3. The circuit of claim 1, wherein:
the first inductor further comprising a fourth coil on a bottom layer of the first inductor; and
the first and second coils have traces of smaller widths than traces of the third and fourth coils.

4. The circuit of claim 3, wherein the third coil has a plurality of loops having traces of an outer loop with widths that are larger than widths of traces of an inner loop.

5. The circuit of claim 3, wherein the fourth coil comprises a plurality of metal layers.

6. The circuit of claim 1, wherein:
the gain stage comprises a current mode logic gain stage; and
the first inductor and the second inductor are coupled to transmit first data of a complementary pair of data.

7. The circuit of claim 6, further comprising:
a third inductor comprising the first plurality of metal layers; and
a fourth inductor comprising the second plurality of metal layers and coupled to a center tap of the third inductor;
wherein the fourth inductor has a diameter that is less than a diameter of the third inductor; and
wherein the third inductor and the fourth inductor are coupled to transmit second data of the complementary pair of data.

8. A circuit for implementing a gain stage in an integrated circuit, the circuit comprising:
a first transistor coupled to receive an input signal at a control terminal; and
a T-coil inductor coupled to the first transistor, the T-coil inductor comprising a first inductor and a second inductor coupled to a center tap of the first inductor, the first inductor having a plurality of coils including a first coil in a first metal layer and having a center tap, the first coil coupled by a first via to a second coil in a second metal layer above the first metal layer and coupled by a second via to a third coil in a third metal layer below the first metal layer;
wherein the second inductor has a diameter that is less than a diameter of the first inductor.

9. The circuit of claim 8, wherein coils of the second inductor are outside coils of the first inductor.

10. The circuit of claim 8, wherein:
the integrated circuit comprises a plurality of metal layers; and
the first inductor comprises a first plurality of metal layers and the second inductor comprises a second plurality of metal layers.

11. The circuit of claim 10, wherein:
the integrated circuit comprises a plurality of metal layers extending from a lower metal layer to an upper metal layer; and
the first inductor is situated above the lower metal layer.

12. The circuit of claim 10, wherein:
the first inductor further comprising a fourth coil on a bottom layer of the first inductor; and
the first and second coils have traces of smaller widths than traces of the third and fourth coils.

13. The circuit of claim 12, wherein the second coil has a plurality of loops having traces of an outer loop with widths that are larger than the widths of traces on an inner loop.

14. The circuit of claim 8, wherein:
the gain stage comprises a current mode logic gain stage; and
the first inductor and the second inductor are coupled to transmit first data of a complementary pair of data.

15. A method of implementing a gain stage in an integrated circuit, the method comprising:
implementing a first inductor in a first plurality of metal layers, the first inductor having a plurality of coils including a first coil in a first metal layer and having a center tap, the first coil coupled by a first via to a second coil in a second metal layer above the first metal layer and coupled by a second via to a third coil in a third metal layer below the first metal layer;
implementing a second inductor in a second plurality of metal layers; and
coupling the second inductor to the center tap of the first inductor;
wherein the second inductor has a diameter that is less than a diameter of the first inductor.

16. The method of claim 15, wherein:
the integrated circuit comprises a plurality of metal layers extending from a lower metal layer to an upper metal layer; and
implementing a first inductor comprises forming the first inductor above the lower metal layer.

17. The method of claim 15, wherein:
implementing a first inductor comprises forming a fourth coil on a bottom layer of the first inductor and the second coil on a top layer of the first inductor; and
the first and second coils are formed having traces of smaller widths than traces of the third and fourth coils.

18. The method of claim 17, wherein implementing a first inductor comprises forming the third coil with a plurality of loops having traces of an outer loop with widths that are larger than widths of traces of an inner loop.

19. The method of claim 17, wherein implementing a first inductor comprises forming the fourth coil of the first inductor in a plurality of metal layers.

20. The method of claim 15, wherein implementing a second inductor in a second plurality of metal layers comprises implementing the second inductor outside of the first inductor.

* * * * *